United States Patent
Kimura et al.

(10) Patent No.: US 6,376,782 B1
(45) Date of Patent: Apr. 23, 2002

(54) RESINOUS CIRCUIT BOARD WITH PINS IMPROVED IN JOINING STRENGTH

(75) Inventors: Kazuo Kimura; Hajime Saiki; Mitsuo Shiraishi; Yosuke Kondo, all of Aichi (JP)

(73) Assignee: NGK-Spark Plug Co., Ltd., Tokyo (JP)

( * ) Notice: Subject to any disclaimer, the term of this patent is extended or adjusted under 35 U.S.C. 154(b) by 0 days.

(21) Appl. No.: 09/494,174

(22) Filed: Jan. 31, 2000

(51) Int. Cl.[7] .............................. H05K 1/11; H05K 1/16; H01R 9/00
(52) U.S. Cl. ...................... 174/267; 174/260; 174/263; 361/773; 361/774
(58) Field of Search ................................ 174/260, 267, 174/263; 361/773, 774, 767

(56) References Cited

U.S. PATENT DOCUMENTS

| | | | | |
|---|---|---|---|---|
| 5,275,330 A | * | 1/1994 | Isaacs et al. .............. | 228/180.2 |
| 5,448,016 A | * | 9/1995 | DiPaolo et al. ............. | 174/126 |
| 5,497,545 A | * | 3/1996 | Watanabe et al. ............. | 29/830 |
| 5,545,598 A | * | 8/1996 | Ogawa et al. ............... | 501/127 |
| 5,699,612 A | * | 12/1997 | Inoue et al. .................. | 29/843 |
| 5,731,066 A | * | 3/1998 | Ando et al. ................. | 428/210 |
| 6,178,188 B1 | * | 1/2001 | Jing et al. ...................... | 372/36 |
| 6,278,797 B1 | * | 8/2001 | Nagasaki et al. ........... | 382/146 |

FOREIGN PATENT DOCUMENTS

| | | |
|---|---|---|
| JP | 60-106370 | 7/1985 |
| JP | 60-106375 | 7/1985 |
| JP | 2678247 | 8/1997 |

* cited by examiner

Primary Examiner—Albert W. Paladini
Assistant Examiner—Quynh-Nhu H. Vu
(74) Attorney, Agent, or Firm—Sughrue Mion, PLLC

(57) ABSTRACT

In a resinous circuit board having a circuitized substrate having conductive layers therewithin, a plurality of pin pads formed on a rear surface of the substrate, and a plurality of pins, each pin having a tip end portion and a head portion and soldered to the pin pad in such a manner as to contact at the head portion to the pin pad. The head portion of the pin consists of a flange section which is larger in diameter than the tip end portion, and a part-spherical abutment section bulging from the flange section in the direction opposite to the tip end portion and brought into contact with the pin pad. The part-spherical abutment section is made of eutectic silver solder which is lower in melting point than solder such as Sn—Ag solder which is used for soldering the pin to the pin pad. Since the silver solder and soft solder are present between the flange section and the pin pad, they can release the stress applied to the pin, thus making it possible to increase the joining strength considerably. Further, the above structure can dispense with holes which are formed in the circuitized substrate and in which pins are press-fitted and fixed as in the prior art circuit board.

20 Claims, 8 Drawing Sheets

RESINOUS CIRCUIT BOARD WITH PINS IMPROVED IN JOINING STRENGTH

BACKGROUND OF THE INVENTION

1. Field of the Invention

The present invention relates in general to a resinous circuit board having a substrate made of resin or a composite material containing resin, and more particularly to a resinous circuit board provided with pins having a high joining strength.

2. Description of the Related Art

As circuit boards for mounting thereon electronic devices, there are heretofore known a ceramic circuit board made of an insulating ceramic material such as alumina and a resinous circuit board made of an insulating resinous material such as epoxy resin and a composite material consisting of resin and glass fiber. In case of a ceramic circuit board having pins serving as input and output terminals thereof, the pins are attached to a substrate by bringing the heads thereof in the form of a nailhead, into contact with pin pads disposed at a front or rear main surface of a substrate and then soldering the heads to the pin pads.

Figure 6:
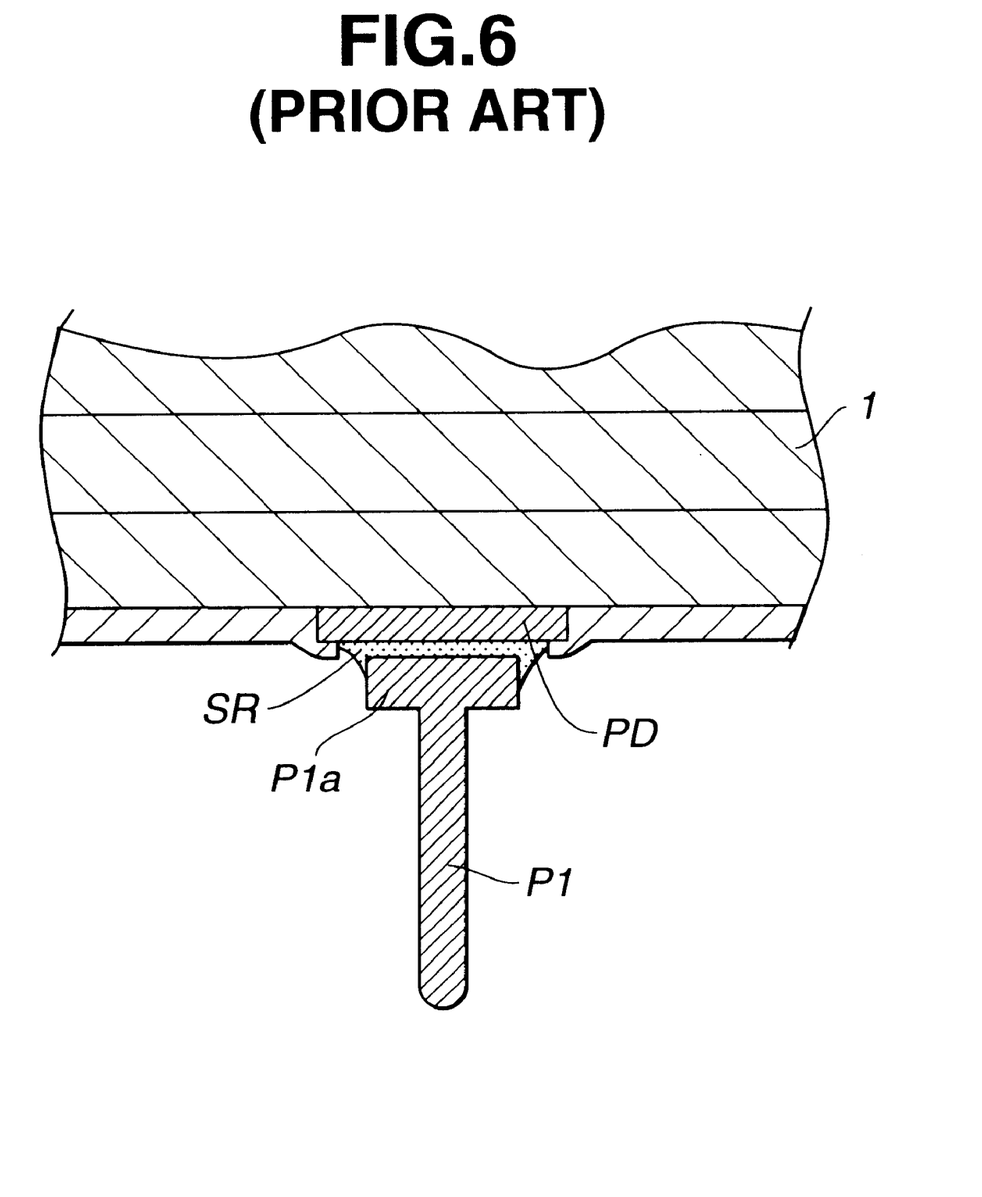
FIG. 6 is an enlarged, fragmentary sectional view of a pin having a head in the form of a nailhead, soldered to a rear surface of a substrate of a circuit device according to a prior art.

In case of a resinous circuit board substrate having pins serving as input and output terminals thereof, it is considered, as shown in FIG. 6, to similarly solder the pins P1 having heads P1a in the form of a nailhead to pin pads PD provided to a substrate 1. However, the pins P1 are low in the joining strength and lack reliability, so they are not fit for practical use. For this reason, in order to increase the joining strength, it has been practiced, as shown in FIG. 7A, to first form through holes TH extending between the upper and lower surfaces (i.e., in the thickness direction) of the substrate 1, then press fit the pins P2 having heads in the form of a nailhead in the through holes TH and fixedly attach the pins P2 to the substrate 1 by using solder SR, or as shown in FIGS. 7B and 7C to first form through holes TH and bottomed holes H in the respective substrates 1, press fit pins P3 and P4 having flanges P3a and P4a at a portion intermediate between the opposite longitudinal ends, into the respective holes TH and H, and fixedly attach the pins P3 and P4 to the substrates 1 by using solder SR.

SUMMARY OF THE INVENTION

Figure 7A:
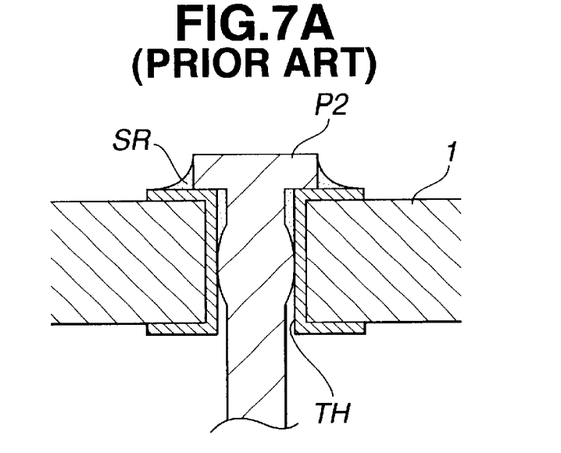
FIGS. 7A to 7C are fragmentary sectional views of a prior art resinous circuit board.
Figure 7B:
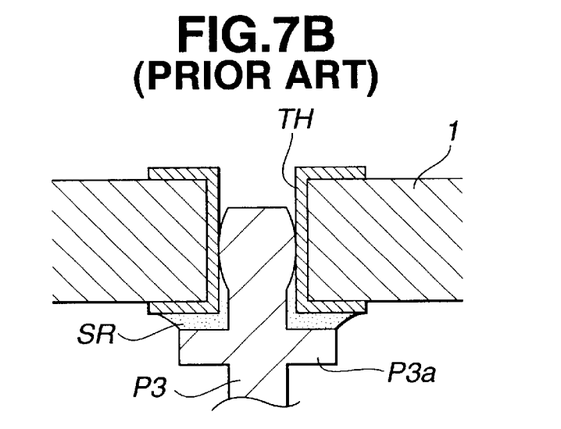
Figure 7C:
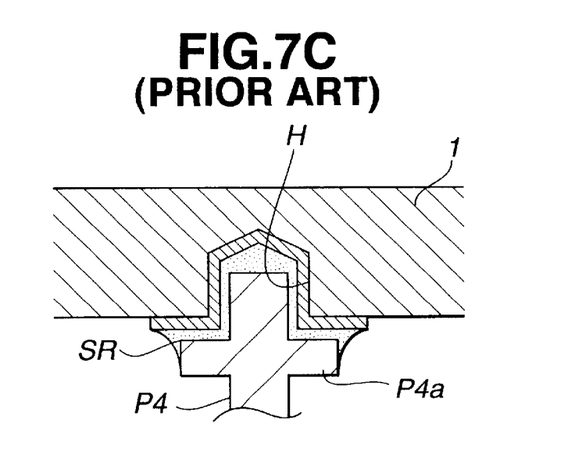

However, as will be understood from FIGS. 7A to 7C, such an arrangement of pins P2, P3 and P4 requires a number of large holes TH and H of the diameter nearly equal to the pins P2, P3 and P4 to be formed in the substrates 1, thus decreasing the area at the front or rear surface for arrangement of wiring conductors (not shown) and therefore considerably lowering the freedom in design of the wiring conductors. For this reason, a complicated wiring requires a increased number of insulating layers to be laminated. Further, the cost for machining the holes is necessitated. Thus, the prior art resinous circuit board is costly.

It is accordingly an object of the present invention to provide a resinous circuit board which has pins joined to its substrate with a high joining strength, while having a high freedom in design of wiring and being of low cost.

To achieve the above object, there is provided according to an aspect of the present invention a circuit device comprising a circuitized substrate made of a resinous material, a plurality of pin pads formed on a surface of the substrate, and a plurality of pins each having a pin main body and an abutment section bulging out from an end of the pin main body, each of the pins being soldered at the abutment section to each of the pin pads, wherein the abutment section is made of solder higher in melting point than solder used for soldering each of the pins to each of the pin pads.

According to another aspect of the present invention, there is provided a circuit board comprising a circuitized substrate made of a resinous material, a plurality of pin pads formed on a surface of the substrate, and a plurality of pins each having a tip end portion and a head portion, each of the pins being soldered to each of the pin pads in such a mariner as to contact at the head portion to each of the pin pads, wherein the head portion includes a flange section integral with the tip end portion and an abutment section bulging out from the flange section in the direction opposite to the tip end portion, the abutment section being made of solder higher in melting point than solder used for soldering each of the pins to each of the pin pads.

As described above, in case a pin made of kovar and having a head in the form of a nailhead is soldered to a pin pad on a resinous substrate similarly to a prior art ceramic circuit board, the joining strength of the pin is low. This is considered due to stress concentration at the joint between the head of the pin and an insulating substrate made of resin or a composite material containing resin. In contrast to this, in the above structure of this invention, the pin is soldered to the pin pad by interposing the abutment section between the flange section of the pin and the pin pad in such a manner as to allow the abutment section to bulge out from the flange section in the direction opposite to the tip end portion. Thus, soft solder or hard solder which is softer than a pin main body made of kovar, 42Ni-Fe, copper or the like, is present between the flange section of the pin and the pin pad. For this reason, the stress caused at the joint between the pin and the pin pad is absorbed by deformation of the soft solder or hard solder and thereby released, so the joint between them is hard to break. Therefore, the above structure of this invention enables to attain a higher joining stress between the pin and the pin pad as compared with the case the pin is directly soldered at the head to the pin pad.

The circuitized substrate includes wiring conductors disposed at least on the front surface, on the rear surface or within thereof, and can be comprised of a single insulating layer or a plurality of insulating layers. The resinous material for the substrate can be resin such as epoxy resin, polyimide resin, BT resin and PPE resin. The resinous material also can be a composite material consisting of organic fibers such as glass fibers and polyester fibers, impregnated with resin, e.g., glass-epoxy resin and glass-BT resin.

The soft solder or hard solder constituting the abutment section is selected from those having a higher melting point than the solder used for soldering the pin to the pin pad, i.e., selected from silver solder such as Ag—Cu alloy, gold solder such as Au—Si alloy, Au—Sn alloy and Au—Ge alloy, and high temperature soft solder such as 95Pb—5Sn and 90Pb—10Sn.

Further, the solder for soldering the pin to the pin pad is determined on consideration of the soldering temperature of an electronic device or devices to be mounted on the circuit board later, e.g., can be selected from Pb—Sn solder such as 37Pb—73Sn eutectic solder, 50Pb–50Sn and 90Pb–10Sn and Sn—Ag solder such as 96.5Sn–3.5Ag.

In case the abutment section having a part-spherical or other bulged shape is made of the same metal as the pin main body, it is a general practice to form the abutment section together with the pin main body by pressing simultaneously so that the abutment section and the pin main body constitutes a single piece. However, since the pin is so small, formation of such a spherical abutment section is quite difficult and the cost per each piece is so high. Generally, the number of pins used in the circuit board is so large, i.e., ranges from hundreds to about one thousand, so a little increase of the cost per piece causes a large increase of the cost of the unit. In this connection, the pin used in this embodiment has the part-spherical abutment section made of solder and covering the side surface of flange section in the form of a nailhead. Thus, the pin main body can have an end in the form of a nailhead and therefore can be formed with ease. Furthermore, by placing a piece of solder on the side surface of the flange section and heating and melting it, the abutment section can be formed into a part-spherical or spherical shape and can be fused to the flange section with ease.

DESCRIPTION OF THE PREFERRED EMBODIMENTS

Embodiment 1

Figure 1A:
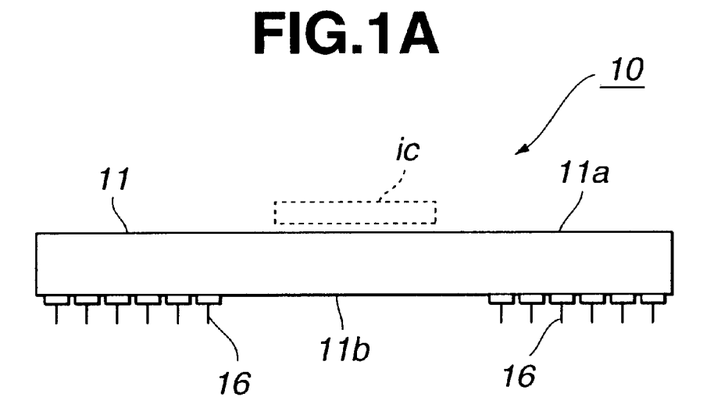
FIG. 1A is a schematic elevational view of a resinous circuit board according to a first embodiment of the present invention.
Figure 1B:
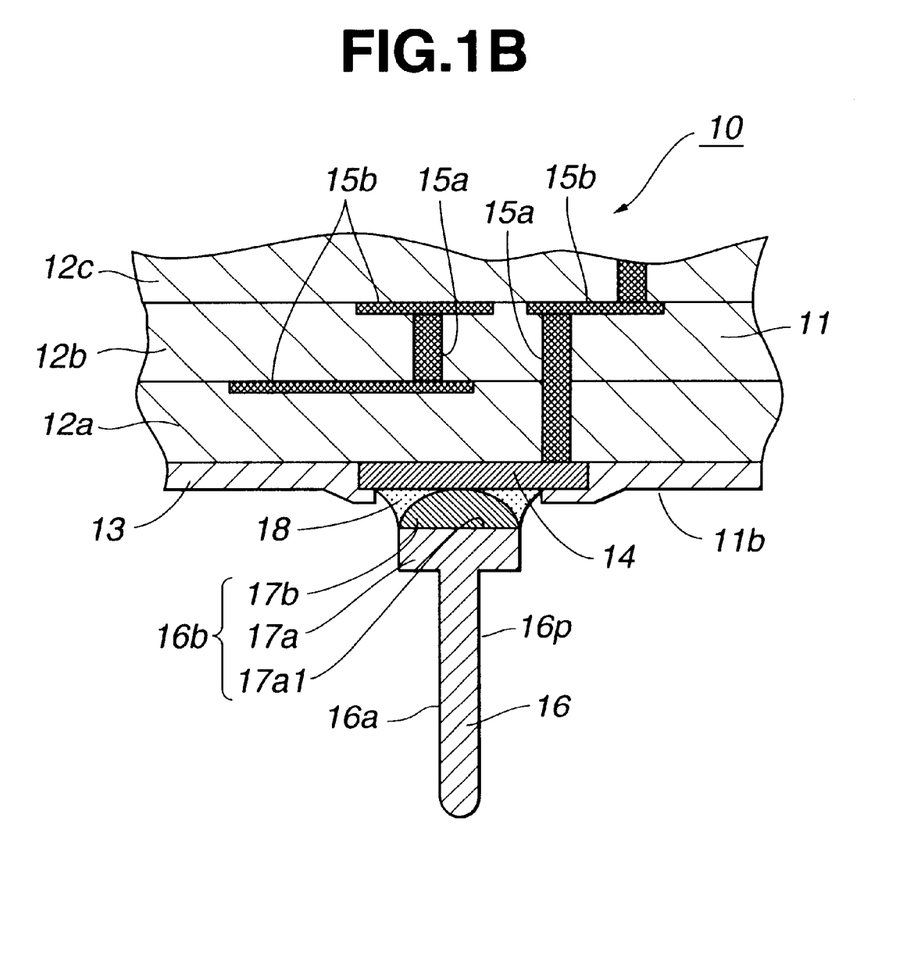
FIG. 1B is an enlarged, fragmentary sectional view of the circuit board of FIG. 1A.
Figure 4:
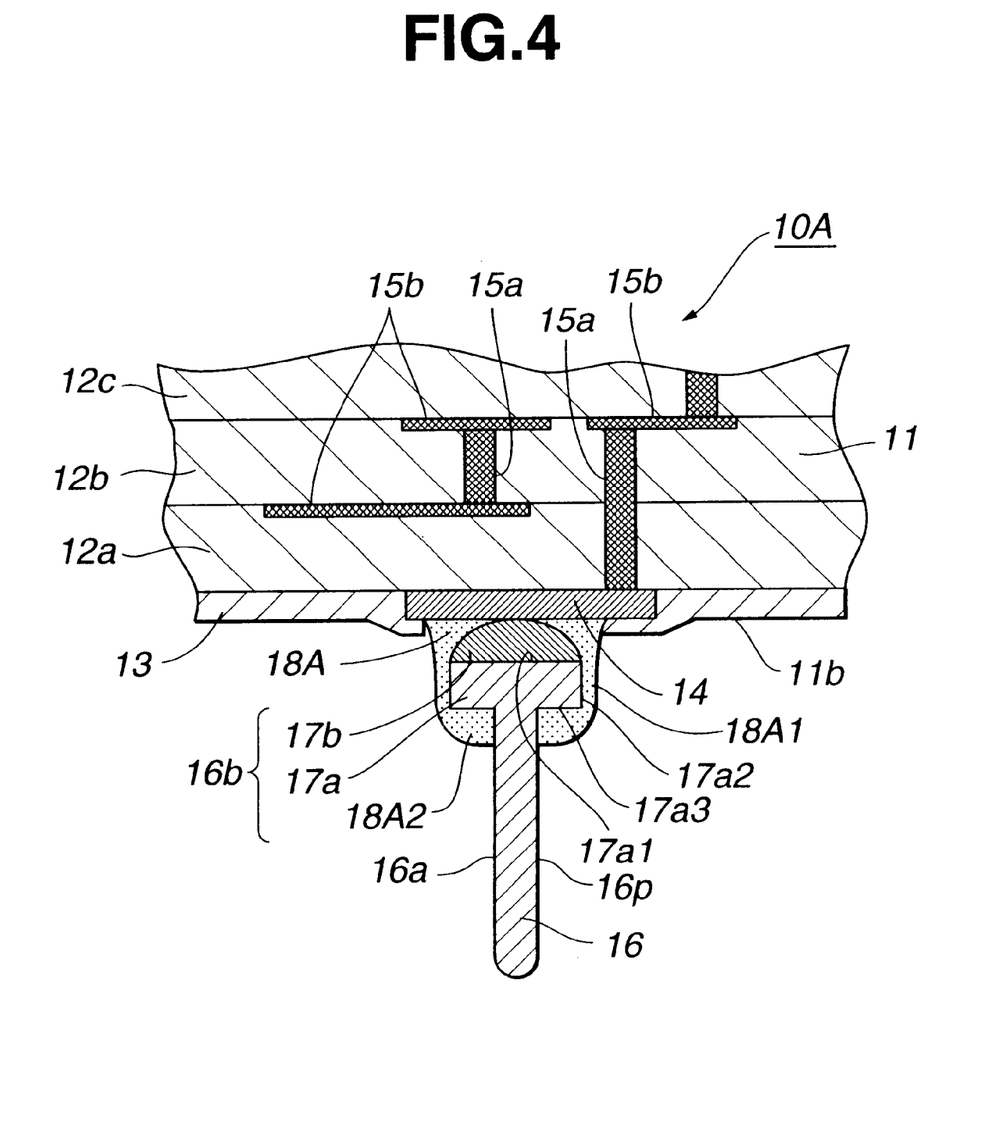
FIG. 4 is a view similar to FIG. 1B but shows a variant of the first embodiment.

Referring to FIGS. 1A–1B to 4, a first embodiment will be described. FIG. 1A shows a resinous circuit device or board 10 which includes a resinous substrate 11 in the form of a plate which is nearly square when observed in a plan view. Formed at and fixed to a rear surface 11b (i.e., lower surface in the drawing) of the substrate 11 are a number of pins 16 which serve as input and output terminals. The substrate 11 is adapted to mount on a front surface 11a thereof an IC chip ic as shown by the dotted line. As shown in FIG. 1B, a circuitized substrate 11 consists of a stacked each other and made of a composite material of a plurality of glass fibers and BT resin. At the lower surface side of the insulating layer 12a there are formed a number of pin pads 14 each of which is made up of a 20 $\mu$m Cu-plated layer and a 5 $\mu$m Ni-plated layer, and there is further formed a solder resist layer 13 in such a manner as to cover a peripheral portion of each pin pad 14. The exposed portion of each pin pad 14, which is not covered by the solder resist layer 13, is nearly circular and 1.2 mm in diameter. In the meantime, within the circuitized substrate 11, there are formed in a known technique vias 15a and internal conductive layers 15b some of which are connected to the pin pads 14. For example, in this embodiment, the vias 15a are formed by first forming holes in the insulating layers 12a, 12b, 12c . . . , then plating the holes and pouring a conductive material into the holes. The conductive layers 15b are formed by plating. Differing from the above described prior art circuit board, as will be readily understood from FIG. 1B, the circuitized substrate 11 of the circuit board 10 of this embodiment is not formed with holes into which the pins 16 are to be press fitted and thereby fixed, so the vias 15a and the internal conductive layers 15b can be designed so as to be located above the pin pad 14 as seen in FIG. 1B.

Pins 16 are soldered with solder 18 and thereby fixedly attached to the pin pads 14. Each pin 16 has a tip end portion 16a and a head portion 16b. The head portion 16b consists of a flange section 17a in the form of a nailhead, which is 0.6 mm in diameter and 0.2 mm thick, and a part-spherical abutment section 17b in engagement with the entire side surface of the flange section 17a and bulging out therefrom in a way as to have a nearly semi-spherical shape which is about 0.6 mm in diameter. By holding the part-spherical abutment 17b held in contact with the pin pad 14, the pin 16 is soldered to the pin pad 14. The tip end portion 16a and the head portion 16b constitute an integral pin main body 16p which is made of kovar (i.e., Fe—Ni—Co alloy) and plated with Ni and Au. Further, the part-spherical abutment section 17b is made of eutectic silver solder (e.g., 72Ag–28Cu : melting point is 780° C.). The solder 18 has such a melting point that enables to attain soldering of the pin 14 at such a temperature that does not cause the part-spherical abutment section 17b to reflow and furthermore that does not cause the solder 18 of itself to reflow at the time of soldering of the IC chip ic. In this embodiment, the eutectic silver solder has a sufficiently high melting point (i.e., 780° C.) so it is not necessitated to make consideration on the reflow of the part-spherical abutment section 17b. Thus, on consideration of the soldering temperature of the IC chip ic, 96.5Sn–3.5Ag solder (melting point is 220° C.) is used.

Figure 2A:
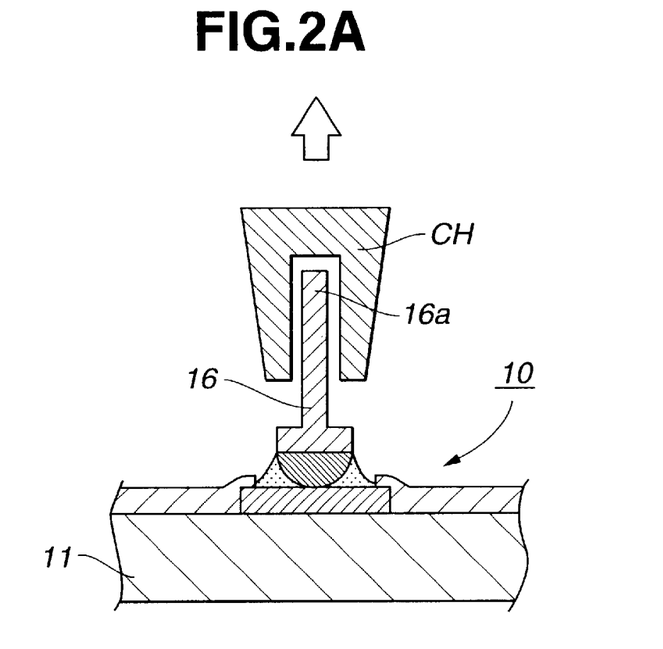
FIG. 2A is an illustration of a method of measuring the joining strength of a pin of the circuit board of FIG. 1A by holding the circuit board horizontally and pulling the pin vertically.

The examination of the joining strength was made with respect to the pins 16 of the resinous circuit board 10 in the following manner. Firstly, as shown in FIG. 2A, under the condition where the circuitized substrate 11 is held horizontal (inclination angle is zero), the tip end portion 16a of the pin 16 is clawed by a chuck CH of a tensile testing machine (not shown) and pulled perpendicularly upward as indicated by the arrow in the drawing to measure the breaking strength of the pin 16 or its joining portion. The same measurement was made with respect to a comparative example which has such a construction shown in FIG. 6 and which is subgtantially the same as the above described circuit board 10 except that the pin does not have a part-spherical abutment section made of silver solder.

Figure 2B:
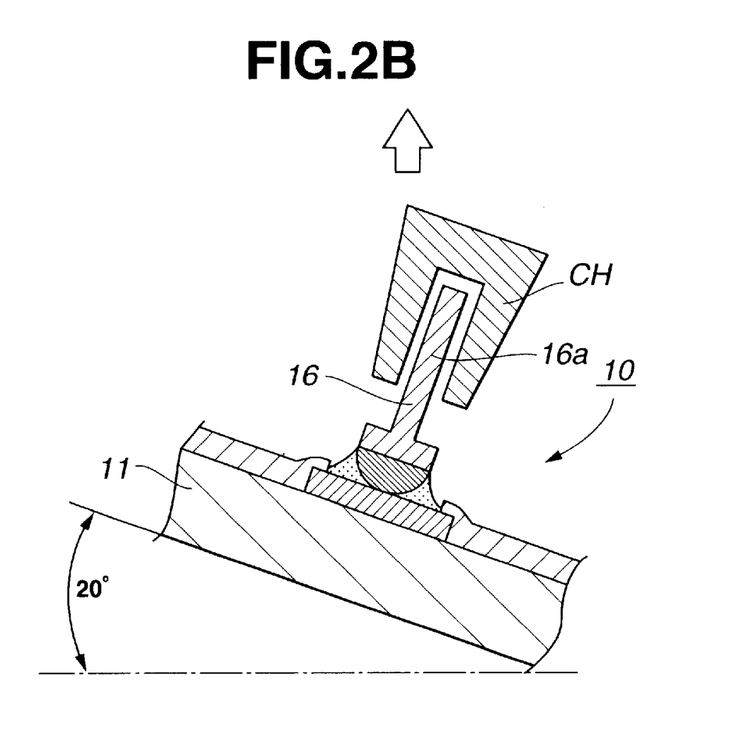
FIG. 2B is an illustration of a method of measuring the joining strength of a pin of the circuit board of FIG. 1A by holding the circuit board inclined by 20 degrees and pulling the pin vertically.

Further, as shown in FIG. 2B, under the condition where the circuitized substrate 11 is held inclined by 20 degrees, the tip end 16a of the pin 16 is clamped by the chuck CH of the tensile testing machine and pulled perpendicularly as indicated by the arrow in the drawing to measure the breaking strength of the pin 16 or its joining portion. In the meantime, similar measurements were made with respect to the comparative example shown in FIG. 6.

TABLE 1

|  | Inclination Angle (degrees) | Joining Strength (Kgf) | | |
|---|---|---|---|---|
|  |  | Average | Max | Min |
| Embodiment 1 | 0 | 3.95 | 4.69 | 3.41 |
| Comparative Example |  | 1.76 | 2.05 | 1.53 |
| Embodiment 1 | 20 | 2.31 | 2.82 | 2.17 |
| Comparative Example |  | 1.11 | 1.25 | 0.95 |

Ten examples of each kind were prepared and examined.

As will be understood from the above table, the joining strength (tensile strength) of the pin 16 in the circuit board 10 of this embodiment could be twice or more of that of the prior art circuit board.

In the comparative example, the flange section P1a in the form of a nailhead and the pin pad PD are located close to each other. In contrast to this, this embodiment is structured such that the part-spherical abutment section 17b made of eutectic silver solder is interposed between the nailhead-like flange section 17a and the pin pad 14 so as to increase the distance between them. Further, as will be understood from the comparison that the Young's modulus (Kg/mm$^2$)of eutectic silver solder is 9200 whereas that of kovar ranges from 14000 to 155500, that of 42 Ni—Fe alloy is 15000 and that of oxygen free copper is 12000, brazing alloy (i.e., hard solder) and solder (i.e., soft solder) are soft and deformable easily. Thus, by the effect of deformation of the brazing alloy and solder existing between the flange section 17a and the pin pad 14, the stress caused between them is released to make it difficult for them or their joining portion to break.

Further, the surface of the pin main body 16p (e.g., flange section 17a) is relatively smooth and its surface roughness is in the range from about 0.05 μm to 0.5 μm Ra. In contrast to this, the surface roughness of the part-spherical abutment section 17b is in the range from 0.5 μm to 5 μm. It is considered that this is due to the fact that surface irregularities and voids are caused in the abutment section 17b when the silver solder is cooled and solidified. Such a rugged surface of the abutment section 17b increases the contact area between the abutment section 17b and the solder 18 to make them joined more firmly and thereby increase the joining strength.

From the foregoing, it will be understood that the circuit board 10 of this embodiment has the pins 16 having a high joining strength and furthermore, differing from the prior art circuit boards shown in FIGS. 7A to 7C, it is not necessitated to form through holes TH or blind holes H for press-fitting of the pins as will be understood from FIGS. 1A and 1B. Due to this, the design freedom in designing the wiring or circuit to be formed within or on the front and rear surfaces of the circuit board can be increased, whereby it becomes possible to constitute a circuit board by a relatively smaller number of insulating layers even if a circuit wiring to be formed is complicated. Accordingly, the circuit board can be lower in cost. Furthermore, since it is not necessitated to form the through holes TH or blind holes H, the circuit board can be further lower in cost in this respect.

Figure 3A:
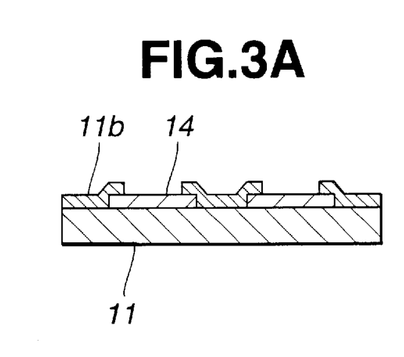
FIGS. 3A to 3E are illustrations of the steps of soldering the pins to a substrate in the circuit board of FIG. 1A.
Figure 3B:
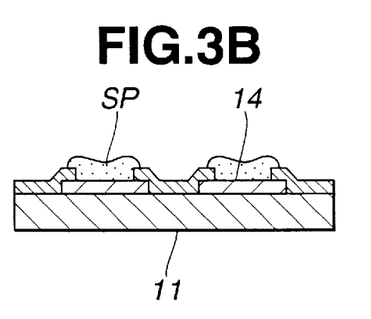

Then, the steps of making the circuit board 10 will be described. The circuitized substrate 11 shown in FIG. 3A is formed by stacking a plurality of insulating layers made of a composite material in a known technique. At the rear surface 11b (i.e., the upper surface in FIG. 3A) are formed a number of the pin pads 14 (though only two is shown in the drawing) so as to have exposed surfaces. Each pad 14 is formed by first forming a Cu-plated layer of 20 μm thick and then forming a Ni-plated layer of 5 μm thick on the Cu-plated layer. In order to prevent oxidation of the Ni-plated layer, a quite thin Au-plated layer of 0.05 μm thick may be formed so as to cover the exposed surface of the pin 14. As shown in FIG. 3B, solder paste SP of Sn—Ag solder is screen printed on the pin pads 14 of the circuitized substrate 11.

Figure 3C:
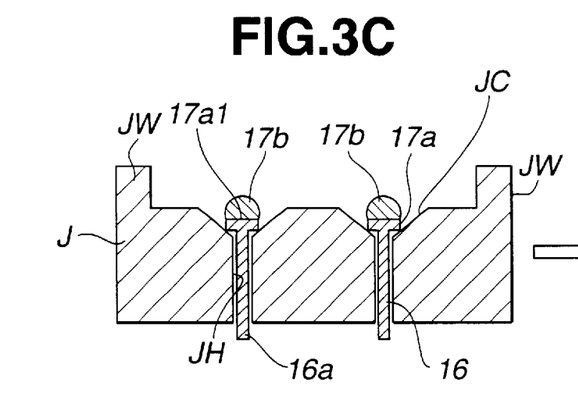

On the other hand, as shown in FIG. 3C, a number of pins 16 having the part-spherical abutment sections 17b fused to the side surface 17a1 of the flange section 17a in the form of a nailnead are prepared and put in a condition where their tip end portions 16a are inserted into through holes JH of a pin aligning jig J made of carbon. The aligning jig J is formed with beveled portions JC at the ends of through holes TH for make it easy to insert the tip end portions 16a into the through holes TH and further provided with a wall portion JW which is brought into contact with the peripheral surface of the circuitized substrate 11 for thereby positioning the substrate 11 relative to the jig J. In the meantime, the jig J is so sized as to allow the tip ends of the pins 16 to protrude therefrom when the pins 16 are thrown into the through holes JH. Further, each pin 16 including the part-spherical abutment section 17b is previously plated with Ni and Au so as to have a 5 μm thick Ni-plated layer and a 0.05 μm thick Au-plated layer. This is for preventing oxidation of the pin main body 16p (i.e., the portion made of kovar) and for improving the solderability.

Figure 3D:
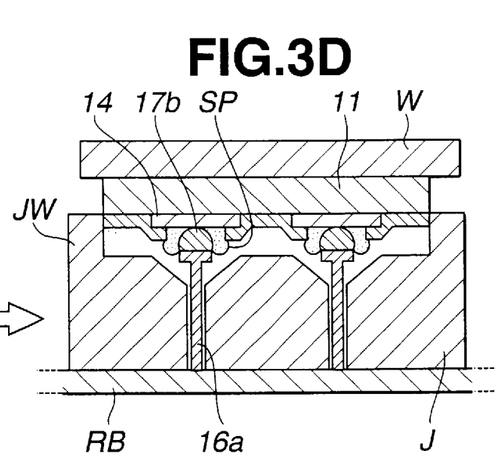

Then, as shown in FIG. 3D, the aligning jig J is placed on a reflow board in the form of a planar plate. Then, the circuitized substrate 11 in the state shown in FIG. 3B is turned upside down, then positioned relative to the jig J by being guided by the wall portion JW and fitted in the jig J. Then, a weight board W is placed on the circuitized substrate 11. In this instance, the tip ends of the pins 16 are brought into contact with the reflow board RB and caused to move upward relative to the jig J, so the part-spherical abutment sections 17b are brought into contact with the pads 14 of the circuitized substrate 11 which is weighed by the weight board W.

Figure 3E:
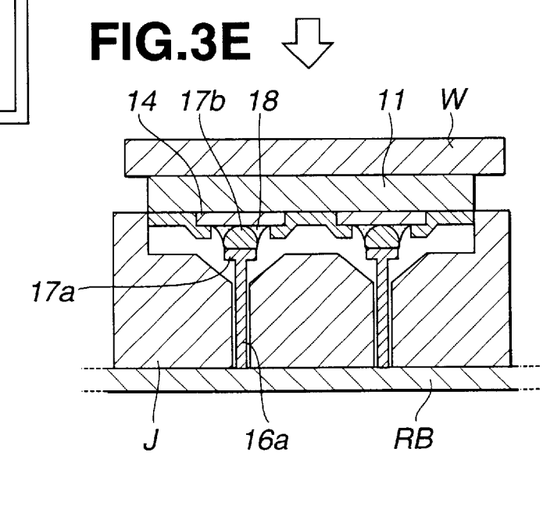

Under this condition, an assembly of the circuitized substrate 11, pins 16, etc. is placed in a reflow furnace (not shown) and heated at the temperature of 220° C. or more and 246° C. in maximum for 2.5 minutes, whereby to cause the solder paste SP to melt and thereby solder with the eutectic solder 18 the pins 16 to the pin pads 14 as shown in FIG. 3E. In this instance, since the part-spherical abutment section 17b is not caused to reflow and maintain its original shape, i.e., a semispherical shape in this embodiment since the melting point of eutectic silver solder is 780° C. For this reason, the flange section 17a and the pin pad 14 are soldered to each other under the condition of being spaced at least a distance equal to the height of the part-spherical abutment section 17b (i.e., 0.3 mm in this embodiment). In the space, there exist silver solder (i.e., part-spherical abutment section 17b) and solder 18. By this, the circuit board 10 is completed.

In the meantime, the pin 16 can be formed with the part-spherical abutment section 17b by allowing silver solder to be fused to a head of the pin main body 16p, i.e., to the flange section 17a and be formed into a semi-spherical shape, by a known technique. For example, though not shown, the pin 16 can be made by such a method wherein a piece of silver solder is placed on the side surface 17a1 of the flange section 17a and heated to be formed into a semispherical shape by surface tension and then cooled. This method is preferable since the volume of the part-spherical abutment section 17a can be controlled by the volume (i.e., size) of the piece of silver solder, so the part-spherical abutment sections 17a having a uniform volume can be formed with ease and at low cost by employing the pieces of silver solder which are controlled so as to have a uniform volume. Since such pins 16 are produced and used in great quantities in the manufacture of ceramic, PGA circuit boards, they are available with ease and at low cost and furthermore stable in quality.

Further, the pin 16 can be produced more easily and at lower cost as compared with such one wherein even a part-spherical abutment section is made of kovar so that the abutment section and the pin main body are formed into a single piece. The pin of such a single piece requires a machining or a particular press forming, thus increasing the cost of the pin.

As will be understood from the foregoing, the height of the part-spherical abutment section can be controlled by controlling the volume of solder to be fused to the flange section. Further, the height of the part-spherical abutment section is not always necessitated to be equal to the radius of the flange section. That is, the height of the part-spherical abutment section 17b can be determined suitably on consideration of the diameter of the pin pad 14 and the diameter of the flange section 17a so that the distance between the pin pad 14 and the flange section 17a is controlled so as to be within a predetermined range.

Variant of Embodiment 1

Referring to FIG. 4, a variant of the first embodiment will be described. This variant differs from the first embodiment only in the amount of solder for joining of the pin 16, so like part of the description to the first embodiment will be omitted or simplified.

As will be understood from FIG. 4, each pin 16 is soldered with solder 18A to the pin pad 14 of the same circuitized substrate 11 as the first embodiment (refer to FIG. 1B). The solder 18A is Sn—Ag solder similarly to the first embodiment but the larger amount is used in this embodiment for soldering of the pin 16. Due to this, as compared with that the solder 18 in the circuit board 10 forms a meniscus (refer to FIG. 1B), the solder 18A in the circuit board 10A wets and extends beyond the circumferential surface 17a2 of the flange section 17a up to the tip end side surface 17a3 of same. Namely, the solder 18A is formed into such a bulged shape that includes a solder section 18A1 around the circumferential surface 17a2 and a solder section 18A2 on the tip end side surface 17A3, thus causing the flange section 17a to be enclosed within the solder 18A.

Soldering with a little excessive amount of solder 18A increases the area of the joint between the solder 18A and the pin 16. Furthermore, in case a tensile stress is applied to the pin 16 to pull the same downward in FIG. 4, the tip end side surface 17a3 in engagement with the solder 18A transmits the stress dispersedly to the surrounding solder section 18A1, thus further increasing the joining strength and therefore enabling to attain the more stable joining.

Embodiment 2

Figure 5A:
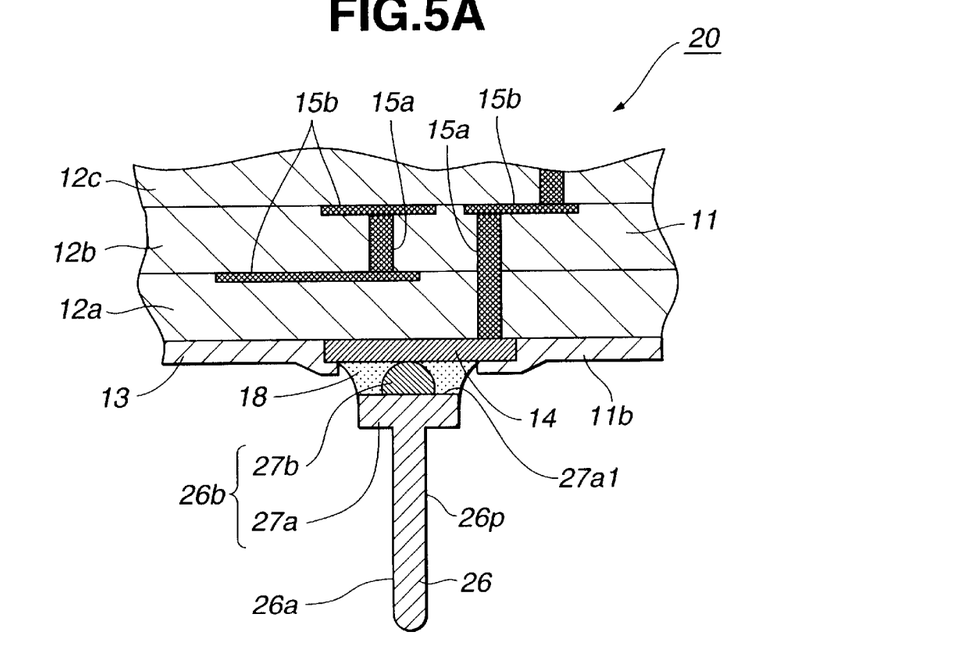
FIGS. 5A and 5B are views similar to FIG. 1B but shows second and third embodiments of the present invention, respectively.

Referring to FIG. 5A, the second embodiment will be described. This embodiment differs from the first embodiment only in the shape of pin, so like part of the description will be omitted or simplified.

As will be understood from FIG. 5A, each pin 26 is soldered with solder 18 to a corresponding pin pad 14 of the same circuitized substrate 11 as the first embodiment. Similarly to the first embodiment, the pin 26 has a flange section 27a in the form of a nailhead. The pin 26 further has an abutment section 27b which is nearly semispherical or part-spherical and made of eutectic silver solder. However, differing from the part-spherical abutment section 17b in the first embodiment, the abutment section 27b is so shaped as to bulge from or as to be in engagement with only part of the side surface 27a1 of the flange section 27a. More specifically, the abutment section 27b is so shaped as to bulge from or as to be in engagement with only a central part of the side surface 27a1. Accordingly, the volume of solder existing between the flange section 27a and the pin pad 14 can be made relatively larger as compared with that in the first embodiment. Further, the distance between the flange section 27a and the pin pad 14 can be made relatively smaller.

Also in the resinous circuit board 20 of this embodiment, silver solder (abutment section 27b) and solder 18 exist between the flange section 27a of each pin 26 and each pin pad 14, thus making it possible to increase the joining strength of each pin 26.

While the method of making the circuit board 20 of this embodiment is generally the same as that of the first embodiment, it differs a little in the method of making the pin 26 so explanation thereto is made. The pin 26 used in this embodiment is made, for example, by first forming the same pin 16 as is used in the first embodiment and then allowing only the abutment section 27b made of silver solder to partly dissolve in etching solution which is, for example, sold under the trade name of GSSD7 and commercially available from Kojima Chemicals Co., Ltd., for thereby causing the abutment section 27b to reduce in volume and size.

Embodiment 3

Figure 5B:
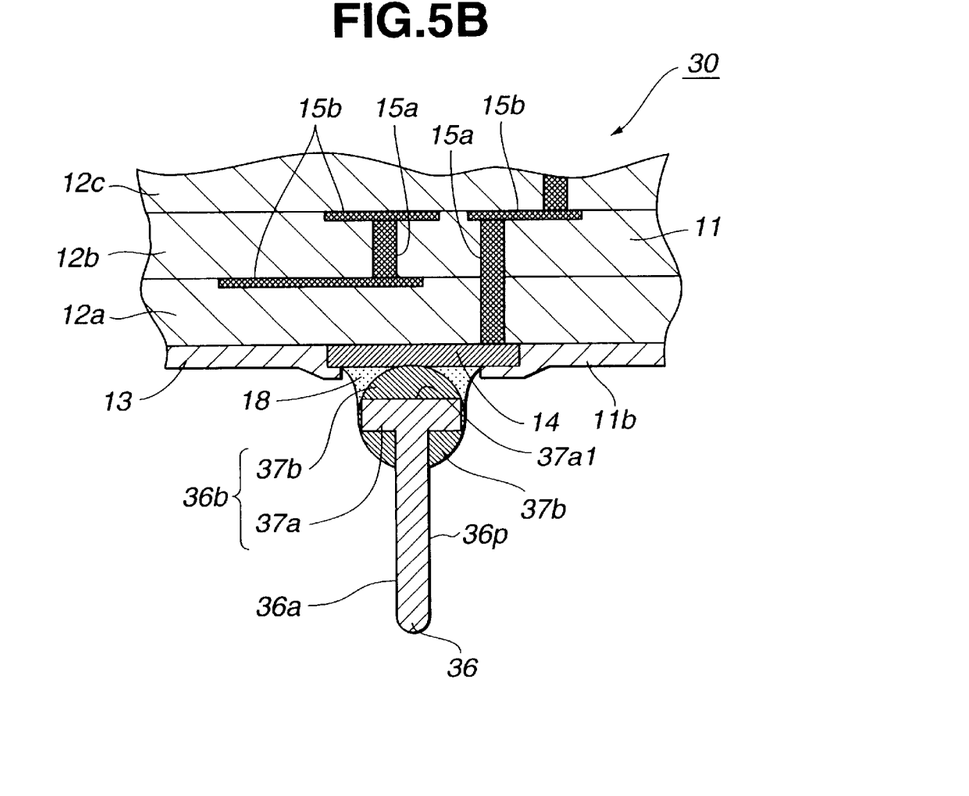

Referring to FIG. 5B, a third embodiment will be described. This embodiment differs from the first embodiment only in the shape of the pin, so like part of the description to the first embodiment will be omitted or simplifies.

As will be understood from FIG. 5B, the pin 36 is soldered with solder 18 to the pin pad 14 of the same circuitized substrate 11 as that of the first embodiment. The pin 36 has a flange section 37a in the form of a nailhead similarly to the first embodiment. The pin 36 further has a nearly spherical abutment section 37b made of eutectic silver solder and so formed as to enclose therewithin the abutment section 37a. By the effect of the silver solder (i.e., spherical abutment section 37b) and the solder 18 which are present between the pin main body 36p made of kovar and the pin pad 14, it becomes possible to make higher the joining strength of the pin 36.

The method of making the circuit board 30 is generally similar to that of the first embodiment except that it differs a little in the method of making the pin 36. The pin main body 36p having a head (i.e., the flange section 37a in the form of a nailhead), which is used also in the first embodiment, is prepared. On the flange section 37a of the pin main body 37 is placed a piece of silver solder which is, though not shown, larger than that used in the first embodiment. The piece of silver solder is heated to melt in such a manner as to wet and extend over not only the side surface 37a1 but the circumferential surface and the tip end side surface of the flange section 37a, then formed into a nearly spherical shape by the effect of surface tension and thereafter cooled to complete the pin 36. By this, similarly to the first embodiment, the spherical abutment section 37b can be controlled so as to be uniform in volume and size by controlling the volume and size of the piece of silver solder. Otherwise, the spherical abutment section 37b can be formed by dipping the flange section 37a into molten silver solder.

Figure 5C:
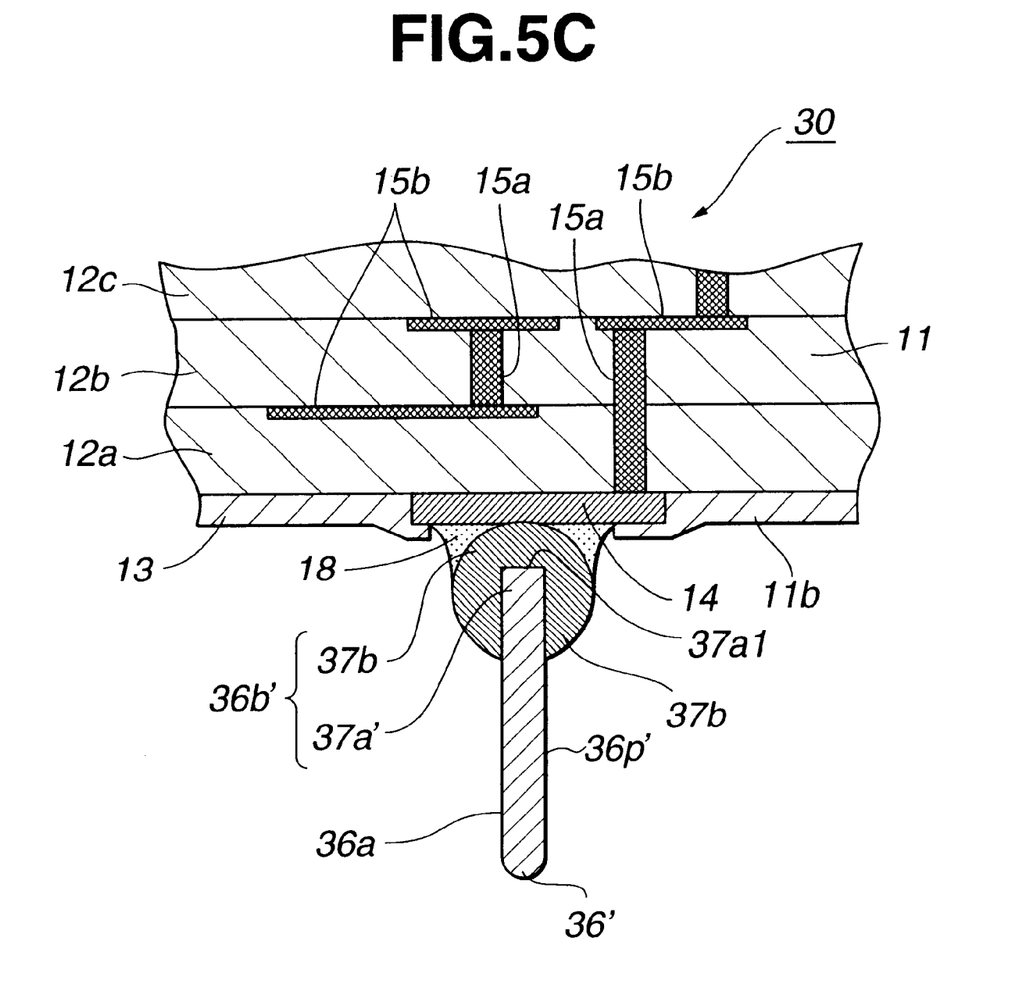
FIG. 5C is a view similar to FIG. 5B but shows a variant of the third embodiment.

While the pin main body 36p has been described and shown as having the flange section 37a in the form of a nailhead, it can be shaped like a straight bar without such a flange section. That is, as shown in FIG. 5C, the pin main body 36p' can be generally uniform in diameter so as to have an end section 37a' which is not provided with a flange section or increased diameter section at an end opposite to the tip end portion 36a. The end section 37a' of the pin main body 36p' can cooperate with the spherical abutment section 37b made of silver solder so as to constitute the head portion 36b' of the pin 36'.

Although certain preferred embodiments have been described and shown, it should be understood that many changes and modifications may be made thereto without departing from the scope of the appended claims.

For example, although eutectic silver solder is used for forming the semispherical abutment section 17b and the spherical section 37b, it can be replaced by gold solder, silver solder other than described above or solder which is higher in melting point than the solder 18 (e.g., 95Pb—Sn solder). Further, although Sn—Ag solder is used for the solder 18, it can be replaced by other solder, e.g., 50Pb–50Sn, on consideration of the soldering temperature of IC chips ic, etc.

Further, although the section of the pin that is brought into contact with the pin pad 14 is shown as being formed into the semispherical abutment section 17b or the spherical section 37b, it can be formed into another shape such as a cylinder and a circular cone. This is because even by so doing, solder and soft solder are present between the flange section 17a and the pin pad 14 and can release the stress. However, in view of the ease of manufacture of the pin, it is preferable to use a pin having a part-spherical or spherical abutment section.

What is claimed is:

1. A circuit device comprising:
    a circuitized substrate made of a resinous material;
    a plurality of pin pads formed on a surface of said substrate; and
    a plurality of pins each having a pin main body and an abutment section made of a first solder bulging out from an end of said pin main body, each of said pins being soldered at said abutment section to each of said pin pads with a second solder;
        wherein said first solder constituting the abutment section has a melting point higher than said second solder used for soldering each of said pins to each of said pin pads.

2. The circuit device according to claim 1, wherein said pin main body has at said end thereof a flange section in the form of a nailhead, said abutment section being part-spherical and bulging out from said flange section.

3. The circuit board according to claim 2, wherein said abutment section covers an entire side surface of said flange section.

4. The circuit board according to claim 2, wherein said abutment section covers part of a side surface of said flange section.

5. The circuit board according to claim 1, wherein said pin main body has at said end thereof a flange section in the form of a nailhead, said abutment section being spherical and enclosing therewithin said flange section.

6. The circuit board according to claim 1, wherein said pin main body is generally uniform in diameter and has an end section including said end thereof, said abutment section being spherical and enclosing therewithin said end section.

7. The circuit board according to claim 1, wherein said resinous material is a composite material containing resin.

8. The circuit board according to claim 1, herein said circuitized substrate includes at least one of a set of conductors disposed within said substrate, a set of conductors disposed on a front surface of said substrate and a set of conductors disposed on a rear surface of said substrate.

9. A resinous circuit board comprising:
    a circuitized substrate made of a resinous material;
    a plurality of pin pads formed on a surface of said substrate; and
    a plurality of pins each having a tip end portion and a head portion including an abutment section made of a first solder, each of said pins being soldered to each of said pin pads with a second solder in such a manner as to contact at said head portion to each of said pins;
        wherein said head portion includes a flange section integral with said tip end portion and the abutment section bulging out from said flange section in a direction opposite to said tip end portion, said first solder constituting the abutment section having a melting point higher than said second solder used for soldering each of said pins to each of said pin pads.

10. The resinous circuit board according to claim 9, wherein said flange section is in the form of a nailhead, and said abutment section is part-spherical and in engagement with an entire side surface of said flange section.

11. A resinous circuit board comprising:
    a circuitized substrate made of a resinous material;
    a plurality of pin pads formed on a surface of said substrate; and
    a plurality of pins each having a tip end portion and a head portion including an abutment section made of a first solder, each of said pins being soldered to each of said pin pads with a second solder in such a manner as to contact at said head portion with each of said pin pads;
        wherein said head portion includes a flange section integral with said tip end portion and the abutment section enclosing therewithin said flange section, said first solder constituting the abutment section having a melting point higher than said second solder used for soldering each of said pins to each of said pin pads.

12. The resinous circuit board according to claim 11, wherein said abutment section has a spherical outer configuration.

13. A resinous circuit board comprising:
    a circuitized substrate made of a resinous material;
    a plurality of pin pads formed on a surface of said circuitized substrate; and
    a plurality of pins each having a tip end portion and a head portion including an abutment section made of a first solder, each of said pins being soldered to each of said pin pads with a second solder in such a manner as to contact at said head portion with each of said pin pads;
        wherein said head portion includes an end section in the form of a rod of a uniform diameter and integral with said tip end portion, and the abutment section enclosing therewithin said end section, said first solder constituting the abutment section having a melting point higher than said second solder used for soldering each of said pins to each of said pin pads.

14. The circuit board according to claim 13, wherein said abutment section has a spherical outer configuration.

15. A method of making a circuit device including a circuitized substrate made of a resinous material, a plurality of pin pads formed on a surface of the substrate, and a plurality of pins soldered to the pin pads, respectively, th d comprising the steps of;

preparing said pins in such a manner that each pin has a pin main body and an abutment section made of a first solder and attached to an end of said pin main body; and soldering said abutment section of each of said pins to each of said pin pads by using a second solder having a melting point lower than said first solder forming said abutment section and in such a manner that said abutment section is not caused to reflow.

16. The circuit device according to claim 1, wherein said second solder is selected from the group consisting of Pb—Sn solder and Sn—Ag solder, said pin main body is made of kovar, and said abutment section is made of a first solder having a melting point higher than said second solder and is selected from the group consisting of silver solder, gold solder and Pb—Sn solder.

17. The resinous circuit board according to claim 9, wherein said second solder is selected from the group consisting of Pb—Sn solder and Sn—Ag solder, said pin main body is made of kovar, and said abutment section is made of a first solder having a melting point higher than said second solder and is selected from the group consisting of silver solder, gold solder and Pb—Sn solder.

18. The resinous circuit board according to claim 11, wherein said second solder is selected from the group consisting of Pb—Sn solder and Sn—Ag solder, said pin main body is made of kovar, and said abutment section is made of a first solder having a melting point higher than said second solder and is selected from the group consisting of silver solder, gold solder and Pb—Sn solder.

19. The resinous circuit board according to claim 13, wherein said second solder is selected from the group consisting of Pb—Sn solder and Sn—Ag solder, said pin main body is made of kovar, and said abutment section is made of a first solder having a melting point higher than said second solder and is selected from the group consisting of silver solder, gold solder and Pb—Sn solder.

20. The method of making a circuit device according to claim 15, wherein said second solder is selected from the group consisting of Pb—Sn solder and Sn—Ag solder, said pin main body is made of kovar, and said abutment section is made of a first solder having a melting point higher than said second solder and is selected from the group consisting of silver solder, gold solder and Pb—Sn solder.

* * * * *